United States Patent

Brandt et al.

[11] Patent Number: 5,835,931
[45] Date of Patent: Nov. 10, 1998

[54] ARRANGEMENT FOR DETERMINING THE CONFIGURATION OF A MEMORY UTILIZING DEDICATED CONTROL DEVICES AND DEDICATED CONTROL LINES

[75] Inventors: Ulrich Brandt; Norbert Kropsch, both of Munich, Germany

[73] Assignee: Siemens Aktiengesellschaft, Munich, Germany

[21] Appl. No.: 775,465

[22] Filed: Dec. 30, 1996

[30] Foreign Application Priority Data

Dec. 29, 1995 [DE] Germany .................. 195 49 062.2

[51] Int. Cl.⁶ ...................................... G06F 12/06
[52] U.S. Cl. .................... 711/5; 711/2; 711/115; 711/170; 711/172; 395/833
[58] Field of Search ............. 711/1, 2, 5, 115, 711/170, 171, 172, 173, 201; 395/830, 833, 281, 284, 182.05, 828

[56] References Cited

U.S. PATENT DOCUMENTS

| | | | |
|---|---|---|---|
| 3,806,881 | 4/1974 | Miwa et al. | 711/5 |
| 4,030,080 | 6/1977 | Burkett et al. | 711/115 |
| 4,481,570 | 11/1984 | Wiker | 711/5 |
| 4,777,590 | 10/1988 | Durkos et al. | 395/800.43 |
| 5,182,801 | 1/1993 | Asfour | 395/200.44 |
| 5,237,674 | 8/1993 | Mohme et al. | |
| 5,241,643 | 8/1993 | Durkin et al. | 711/115 |
| 5,509,138 | 4/1996 | Cash et al. | 711/170 |
| 5,668,974 | 9/1997 | Grassi et al. | 711/157 |
| 5,737,765 | 4/1998 | Shigeeda | 711/170 |

FOREIGN PATENT DOCUMENTS

| | | |
|---|---|---|
| 0 224 877 | 6/1987 | European Pat. Off. . |
| 0 394 935 | 10/1990 | European Pat. Off. . |
| 42 15 486 A1 | 12/1992 | Germany . |
| 2 255 843 | 11/1992 | United Kingdom . |

*Primary Examiner*—Tod R. Swann
*Assistant Examiner*—J. Peikari
*Attorney, Agent, or Firm*—Hill & Simpson

[57] ABSTRACT

A memory configuration system including least one of plural control lines and address lines from a memory controller to attached memory may be used as a capacity indicating line, a presence indicating line, and/or a memory type indicating line. With the assistance of coding circuitry dedicated to each mounting region, capacity, presence, and type information for the attached memory module(s) may be communicated via their respective lines. This information is used by the controller to establish a memory configuration.

20 Claims, 1 Drawing Sheet

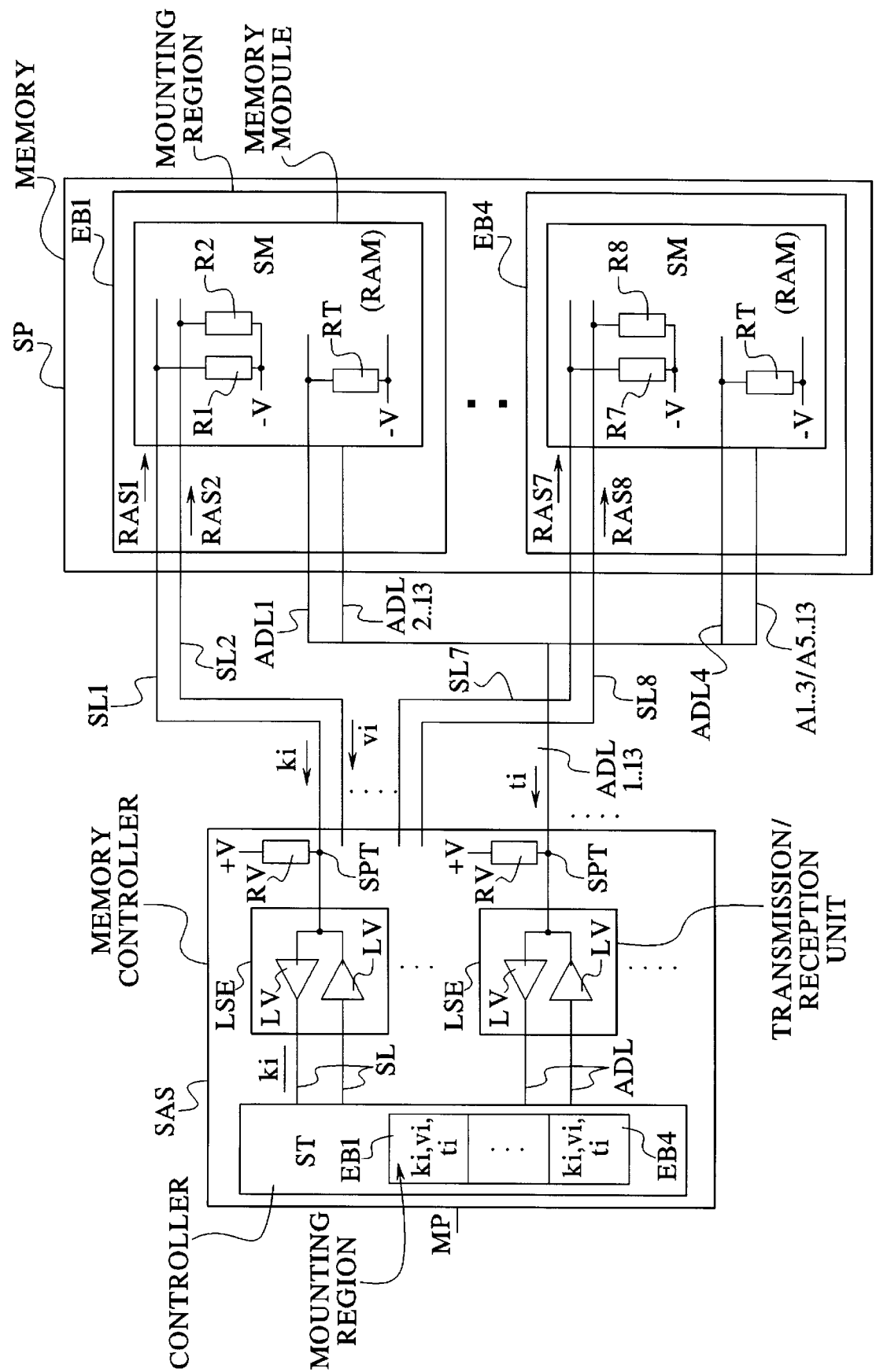

ARRANGEMENT FOR DETERMINING THE CONFIGURATION OF A MEMORY UTILIZING DEDICATED CONTROL DEVICES AND DEDICATED CONTROL LINES

SPECIFICATION

BACKGROUND OF THE INVENTION

Memories are usually formed by mouting areas into which memory modules can be inserted. The mounting areas thereby represent plugin locations into which memory modules of the greatest variety of types having different memory capacities can be plugged. The mounting areas or, respectively, the plugin locations are thereby adapted to commercially obtainable memory modules or, respectively, memory components. The reading and writing of information in the memories is usually implemented with a memory controller. In addition to the data lines required for the communication of the data that have been read or are to be written, n address lines—for example 13 address lines—are conducted from the memory controller to the mounting regions or, respectively, plugin regions. Voltage potentials are controlled at these address lines in the memory controller that by narrowly encoded address information proceed to all mounting regions or, respectively, to memory modules plugged or, respectively, inserted into these.

For error-free drive, the memory controller or driver must know the configuration of the memory of the memory arrangement. This means that knowledge about the presence of memory modules in the mounting regions and knowledge about the memory capacity of the inserted memory modules must be available in the memory controller. This is usually achieved by information—for example, voltage potentials—applied to the terminals of the memory controller or by a programming of an internal memory. This means additional setting or, respectively, programming outlay.

SUMMARY OF THE INVENTION

It is an object of the present invention to reduce this additional setting or, respectively, programming outlay.

In general terms the present invention is an arrangement for determining the configuration of a memory that is formed by mounting regions accepting memory modules to which address lines proceeding from a memory controller are conducted in parallel and having at least respectively one control line individually associated to mounting region from the memory controller to each mounting region. At least one of the address or control lines is defined as information line for each mounting region. Coding means form and communicate configuration information individually associated to mounting region from the memory to the memory controller via the at least one information line. Evaluation means in the memory controller evaluate and store the configuration information communicated via the information line individually associated to mounting region.

An important aspect of the inventive method is that at least one of the control lines or address lines conducted to the mounting regions is used as additional information line. To this end, coding means are provided for forming and communicating capacity information via a capacity line and presence information via a presence line, whereby the presence information indicate memory modules inserted into the mounting region—that is, their presence—and the capacity information indicate their memory capacity. Evaluation means are provided in the memory controller for an evaluation of the capacity and presence information communicated via the capacity line and presence line individually adapted to mounting region.

According to an advantageous development of the inventive method, at least respectively one of the further address or control lines is defined as type line for each of the mounting regions. Additional coding means individually associated with mounting region are provided for forming and communicating type information individually associated to memory module, whereby the type information respectively indicate the type of inserted memory module. Additional evaluation means are provided therefor in the memory controller for evaluation and storing of the type information communicated via the type line individually associated to mounting region. This means an expansion of the inventive method for the communication of a type information indicated in the memory module—for example, DRAM or SRAM—to the memory controller.

According to an advantageous development of the inventive method, a predetermined resistor connected to a predetermined voltage potential is connected to the capacity, presence or, respectively, type line as coding means in the memory controller, and a resistor indicating the presence or, respectively, the memory capacity or, respectively, the type in each memory module inserted into a mounting region is connected to the respective capacity or, respectively, presence or, respectively, type line and to a predetermined voltage potential. This means that the resistor that is connected both to the capacity line as well as to a predetermined voltage potential is defined, for example, dependent upon the memory capacity of the memory module—for example, one or four Mbytes. Given a resistor prescribed with a predetermined voltage potential in the memory controller, different voltage potentials occur at the voltage division point of the capacity line dependent on the height of the resistance set in the mounting region or, respectively, memory module, the memory capacity, the presence or, respectively, the type of the inserted memory module being indicated to the memory controller on the basis of these different voltage potentials. In order to achieve an unambiguous voltage divider function, the resistor is connected to the voltage potential corresponding to the voltage supply in the memory controller and is connected to the grounded potential in the mounting regions. The resistor provided in the memory controller per capacity, presence or, respectively, type line is to be dimensioned such that voltage potentials for forming address and control information can be connected by the memory controller to the n address lines or, respectively, control lines, whereby the formation of control or, respectively, address information is deactivated during the communication of the configuration information. This means that the resistors in the memory controller and in the mounting regions are to be dimensioned such that the voltage potentials for a formation of address and control information can be connected onto the n address or, respectively, control lines and voltage potentials are achieved with which the memory can be addressed or, respectively, with which the corresponding control can be effected.

Given a plurality of capacity lines, the capacity, presence or, respectively, type information for the identification of the mounting regions are formed by binarily encoded capacity, presence or, respectively, type information. This means that a voltage potential respectively representing the binary 0 or 1 information is controlled such to the capacity, presence or, respectively, type lines that a binarily encoded capacity, presence or, respectively, type information is represented by the combined view of the voltage potentials present at the capacity, presence or, respectively, type lines.

BRIEF DESCRIPTION OF THE DRAWINGS

The drawing FIGURE shows the embodiment of the invention including a memory configuring arrangement with attached memory modules.

DETAILED DESCRIPTION OF THE INVENTION.

The features of the present invention which are believed to be novel, are set forth with particularity in the appended claims. The invention, together with further objects and advantages, may best be understood by reference to the following description taken in conjunction with the accompanying drawing, in which:

The block circuit diagram depicted in the single Figure shows a memory controller SAS and two of four mounting regions EB1 . . . 4 that form the memory SP together. Instead of the four mounting regions EB1 . . . 4, different mounting regions adaptable to the respective application can be inventively fashioned. Let it also be assumed with reference to the exemplary embodiment that memory modules SM having a memory capacity K1,4 of one or four MBytes can be inserted or, respectively, plugged into these mounting regions EB1 . . . 4 that are realized with suitable plugin locations. In the exemplary embodiment, the memory modules SM represent small printed boards with integrated RAM memories (Random Access Memory) that, for example, are also employed in personal computers—indicated in the block circuit diagram by a word RAM placed in parentheses.

The memory controller SAS contains a controller ST that contains the known functions of a commercially obtainable RAM memory controller—known as RAM controller in the technical field.

Respectively two control lines SL1 . . . 8 are conducted into the memory controller SAS from each mounting region EB1 . . . 4. RAS signals RAS0 . . . 7 (Row Address Strobe) often employed by the memory controller SAS, for example, are transmitted via these control lines SL1 . . . 8. The columns or, respectively, rows of the memory SP are addressed together with a CAS signal (Column Address Strobe), that is, the existing addresses are defined as row or, respectively, column addresses given a predetermined voltage potential. When a RAS signal RAS0 . . . 7 is not present, the control lines SL1 . . . 8 respectively comprise a high voltage potential, whereby this voltage can differ in practice on the basis of realization tolerances. In order to avoid these voltage fluctuations, each control line SL1 . . . 8 in the memory controller SAS is conducted to the stabilized supply voltage +V via a drop resistor RV—shown only once by way of example for the 8 control lines SL1 . . . 8 in the block circuit diagram. Further, a respective line transmission/reception unit LSE is connected to each control line SL1 . . . 8 in the memory controller SAS—one of the 8 line transmission/reception units LSE is shown by way of example in the block circuit diagram. In each of the line transmission/reception units LSE, the control line SL1 . . . 8 is conducted to the input of a line amplifier LV and an output of a further line amplifier LV. The output or, respectively, the input of the two line amplifiers LV is connected to the controller ST. The voltage potentials that are received or, respectively, that are to be transmitted are forwarded unmodified by the line amplifiers LV, whereby an impedance transformation is merely implemented. During the transmission of the capacity, presence and type information ki, vi, ti, the line amplifiers LV acting in the direction of a mounting regions EB1 . . . 4 become high-impedance, that is, are deactivated. The line amplifier LV acting in the direction of the controller ST remains activated and forwards the voltage potential occurring at the voltage divider point SPT to the controller ST for the purpose of a measurement and evaluation.

In each of the mounting regions EB1 . . . 4, one of the control lines SL1 . . . 8 is defined as capacity line and one is defined as presence line—the first control line SL1 as capacity line and the second control line SL2 as presence line in the exemplary embodiment for the first mounting region EB1. The two control lines SL1 . . . 8 of a mounting region EB1 . . . 4 are respectively connectable to a resistor R1 . . . 8. The terminal configuration of the two resistors R1 . . . 8 is implemented dependent on the presence of a plug memory module SM and the memory capacity thereof. When no memory module SM is plugged, no second resistor R2, 4, 6, 8 is connected from the negative voltage potential −V—grounded potential in practice—to the respective control lines SL2, 4, 6, 8 representing the presence line. Upon insertion of a memory module SM, a second resistor R2, 4, 6, 8 arranged on the board or, respectively, the memory module SM is connected from grounded potential −V to the control line SL2, 4, 6, 8 representing the respective presence line. This means that the voltage level at the voltage divider point SPT for the respective control line SL2, 4, 6, 8 in the memory controller SAS drops to a low voltage level insofar as the line amplifier LV acting in the direction of the mounting regions EB1 . . . 4 is switched high-impedance by the controller ST. The low voltage level consequently informs the memory controller that a memory module SM is pluged in the respective mounting region EB1 and a high voltage potential indicates that no memory module SM is pluged in the respective mounting region EB1 . . . 4. Corresponding to the voltage level measured by the control unit ST, a presence information vi is formed therein—advantageously represented by a binary information—and is stored. The controller ST switches the line amplifiers LV acting in the direction of the mounting regions EB1 . . . 4 high-impedance merely for measuring the communicated capacity, presence and type information ki, vi, ti.

Given a plug memory module SM in a mounting region EB1 . . . 4, the memory capacity is indicated by the configuration of the first resistor R1, 3, 5, 7. When no first resistor R1, 3, 5, 7 to be arranged in the memory module SM is connected from grounded potential −V to the respective control line SL1, 3, 5, 7 representing the capacity line, then the inserted memory module SM comprises a large memory capacity—for example, 4 MBytes—and when a first resistor R1, 3, 5, 7 is connected, then the inserted memory module SM comprises a small memory capacity—for example, 1 MByte.

Different voltage levels that are forwarded to the control unit ST via the line transmission/reception unit LSE and are measured thereat occur in the memory controller SAS at the voltage divider point SPT of the respective control line SL1, 3, 5, 7 dependent on the configuration of the first resistor R1, 3, 5, 7. Dependent on the height of the measured voltage level, a capacity information ki indicating a large or small memory capacity is formed for each mounting region EB1 . . . 4 and is stored individually associated to mounting region. The two resistors R1 . . . 8 can be respectively configured upon manufacture of the memory modules FM or, respectively, of the boards, that is, can be introduced into these in a fashion that is economical in terms of manufacturing technology.

Further, 13 address lines ADL1 . . . 13 proceeding from the control unit ST of the memory controller SAS are connected parallel to each mounting region EB1 . . . 4 in the exemplary embodiment via a respective line transmission/reception unit LSE. The address lines ADL are conducted to the memory modules SM in the mounting regions EB1 . . . 4. Let it be assumed for the exemplary embodiment that an additional configuration information, namely a type information ti, is to be communicated via respectively one of the address lines ADL1 . . . 13. To this end, the first through fourth address line ADL1 . . . 4 is defined as type line for the first through fourth mounting region EB1 . . . 4. As type information ti, for example, a high voltage potential represents a "fast memory module" and a low voltage potential represents a "slow memory module".

Analogous to the interconnection of the control lines SL1 . . . 8, the four defined address lines ADL1 . . . 4 in the memory controller SAS are respectively connected to the positive supply voltage +V via a respective resistor RV—indicated in the block circuit diagram by the resistor RV. A type resistor RT connected to the grounded potential −V is connectable to the allocated address lines ADL1 . . . 4 in the mounting regions EB1 . . . 4 indicated by an illustrated resistors RT in the block circuit diagram. With reference to the exemplary embodiment, no resistors RT are connected given fast inserted memory modules SM and resistors RT are connected given slow inserted memory modules SM. The communication and measurement of the voltage potential at the voltage divider point SPT ensues in a way analogous to the communication and measurement of the capacity and presence information vi. Faulty occupations of the mounting regions EB1 . . . 4 can be identified by these measurements, that is, all mounting regions EB1 . . . 4 must be equipped with slow or fast memory modules SM since memory modules SM having different access speeds do not collaborate. The unwired address lines ADL2–12 . . . A1–3/5–13—that is, the address lines that do not comprise any resistor connection—are conducted to the plugin devices of the memory modules SM in the respective mounting regions EB1 . . . 4.

Given a plurality of address lines ADL, alternatively, a type information ti to be communicated is indicated by a binary coding of the address lines ADL—not shown—whereby a non-connected resistor RT represents high potential and, thus, a binary 1 information and a connected resistor RT represents a low voltage potential and, thus, a binary 0 information at the voltage divider point SP. In particular, the type of inserted memory module SM is indicated—for example, SRAM or DRAM—via the existing address lines ADL with the type information ti, whereby a predetermined plurality of address lines ADL is respectively allocated to a mounting region EB1 . . . 4. Since the memory modules SM are usually realized by the greatest variety of components and component types, a check to which extent uniform memory component types or memory component types that collaborate in practice are inserted into the respective mounting regions EB1 . . . 4 is possible by communicating the type information ti to the control unit ST of the memory controller SAS.

As a result of the inventive arrangement, consequently, a communication of capacity and presence information ki, vi as well as a communication of type information ti and a further configuration information that have not been described is possible, as a result whereof extensive knowledge about the memory capacity and the presence of memory modules SM and knowledge about the memory component types employed is present in the control unit ST.

The voltage potentials adjacent at the voltage divider points SPT of the address lines ADL representing the type lines are thereby forwarded to the control unit ST via the line transmission/reception units LSE. The voltage potentials are measured in this control unit ST and, following a decoding, are stored as type information—advantageously, in a binary form. It is thereby to be noted that respectively defined address lines ADL are allocated to defined mounting regions EB1 . . . 4 taking the addressing method or, respectively, the addressing method utilized into consideration in order to achieve an unambiguous allocation of the communicated type information ti to the mounting regions EB1. . . 4.

The measurement of the voltage potentials adjacent at the voltage divider point SPT can be implemented by an externally arranged analog-to-digital converter module or by an analog-to-digital converted module that is integrated in the control unit ST or is already present therein—not shown. Given an external arrangement, the line transmission/reception units LSE are external, that is, are not to be realized in the memory controller SAS. With reference to the stored configuration information ki, vi, ti, a suitable setting for driving the inserted memory modules SM can be calculated by the control unit of the memory controller SAS independently, that is, automatically, whereby the memory controller SAS, as known, is connected to a microprocessor MP that controls and monitors the memory controller SAS.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An arrangement for determining a configuration of a memory that is formed by mounting regions accepting memory modules to which address lines proceeding from a memory controller are connected in parallel and having at least respectively one control line individually associated to mounting region from the memory controller to each mounting region comprising:, at least one of the address or control lines being defined as an information line for each mounting region;

coding device for forming and communicating configuration information individually associated to mounting region from the memory to the memory controller via the at least one information line; and evaluation device in the memory controller for evaluation and storing of configuration information communicated via the information line individually associated to mounting region.

2. The arrangement according to claim 1, wherein at least respectively one of the address lines and control lines connected between the memory controller and a mounting region is defined as a capacity line for each mounting region; and wherein coding devices individually associated to mounting region are provided for forming and communicating capacity information via a respective capacity line, the capacity information respectively indicating memory capacity of inserted memory modules.

3. The arrangement according to claim 1, wherein at least respectively one line of further address line and control lines connected between the memory controller and a mounting region is defined as a presence line for each mounting region; and wherein devices individually associated to mounting region are provided for forming and communicating presence information via a respective presence line, the presence information respectively indicating presence of a memory module inserted into a respective mounting region.

4. The arrangement according to claim 1, wherein at least one line of further address lines and control lines is defined as a type line for each of the mounting regions; wherein additional coding devices individually associated to mounting region are provided for forming and communicating type information individually associated to memory module, the type information respectively indicating the type of inserted memory module; and wherein additional evaluation devices are provided in the memory controller for evaluation and storing of the type information communicated via a type line individually associated to mounting region.

5. The arrangement according to claim 1, wherein the coding device comprises:
   a predetermined first resistor, connected to a predetermined first voltage potential, connected to each capacity, presence or, respectively, type line in the memory controller; and
   a second resistor, indicating the presence or, respectively, the memory capacity or, respectively, the type of memory module inserted in a mounting region, connected to the respective capacity or, respectively, presence or, respectively, type line and to a predetermined second voltage potential for each memory module inserted in a mounting region.

6. The arrangement according to claim 5, wherein the first resistors in the memory controller are connected to the voltage potential provided for the voltage supply and the second resistors in the mounting regions are connected to a grounded potential.

7. The arrangement according to claim 5, wherein the first and second resistors provided in the memory controller and the mounting regions per capacity, presence or, respectively, type line are dimensioned such that voltage potentials formed by the memory controller for formation of control or, respectively, address information are connectable to the control lines or, respectively, address lines, the formation of control or, respectively, address information being deactivated during transmission of the configuration information.

8. The arrangement according to claim 7, wherein voltage evaluation devices for the evaluation of the voltage potentials adjacent at the capacity, presence or, respectively, type line are provided in the memory controller and are structured such that, dependent on adjacent voltage potential, a capacity, presence or, respectively, type information indicating the memory capacity, the presence or, respectively, the type of the inserted memory module is formed and stored memory-conforming for each mounting region, apparatus for communicating the control and address information to the mounting region being switched high-impedance.

9. The arrangement according to claim 8, wherein the capacity, presence or, respectively, type information are represented and stored by binary information.

10. The arrangement according to claim 1, wherein, given a plurality of capacity, presence or, respectively, type lines, the capacity, presence or, respectively, type information are formed by binarily encoded capacity, presence or, respectively, type information.

11. The arrangement according to claim 10, wherein additional decoding devices for evaluation of the binarily encoded voltage potentials adjacent at the capacity or, respectively, presence or, respectively, type lines are provided in the memory controller and structured such that, dependent on the adjacent, binarily encoded voltage potentials, a capacity, presence or, respectively, type information indicating the memory capacity, the presence or, respectively, the type of inserted memory module is formed and stored.

12. An arrangement for determining a configuration of a memory that is formed by mounting regions accepting memory modules to which address lines proceeding from a memory controller are connected in parallel and having at least respectively one control line individually associated to mounting region from the memory controller to each mounting region comprising:,
   at least one of the address or control lines being defined as an information line for each mounting region;
   coding devices for forming and communicating configuration information individually associated to mounting region from the memory to the memory controller via the at least one information line, the coding devices individually associated to mounting region for forming and communicating capacity information via a respective capacity line, the capacity information respectively indicating memory capacity of inserted memory modules;
   evaluation device in the memory controller for evaluation and storing of configuration information communicated via the information line individually associated to mounting region,
   at least respectively one of the address lines and control lines connected between the memory controller and a mounting region is defined as a capacity line for each mounting region;
   at least respectively one line of further address line and control lines connected between the memory controller and a mounting region defined as a presence line for each mounting region;
   devices individually associated to mounting region are provided for forming and communicating presence information via a respective presence line, the presence information respectively indicating presence of a memory module inserted into a respective mounting region; and
   at least one further line of further address lines and control lines defined as a type line for each of the mounting regions;
   additional coding devices individually associated to mounting region for forming and communicating type information individually associated to memory module, the type information respectively indicating the type of inserted memory module; and
   additional evaluation devices in the memory controller for evaluation and storing of the type information communicated via a type line individually associated to mounting region.

13. The arrangement according to claim 12, wherein the coding device comprises:
   a predetermined first resistor, connected to a predetermined first voltage potential, connected to each capacity, presence or, respectively, type line in the memory controller; and
   a second resistor, indicating the presence or, respectively, the memory capacity or, respectively, the type of memory module inserted in a mounting region, connected to the respective capacity or, respectively, presence or, respectively, type line and to a predetermined second voltage potential for each memory module inserted in a mounting region.

14. The arrangement according to claim 13, wherein the first resistors in the memory controller are connected to the voltage potential provided for the voltage supply and the second resistors in the mounting regions are connected to a grounded potential.

15. The arrangement according to claim 13, wherein the first and second resistors provided in the memory controller and the mounting regions per capacity, presence or, respectively, type line are dimensioned such that voltage potentials formed by the memory controller for formation of control or, respectively, address information are connectable to the control lines or, respectively, address lines, the formation of control or, respectively, address information being deactivated during transmission of the configuration information.

16. The arrangement according to claim 15, wherein voltage evaluation devices for the evaluation of the voltage potentials adjacent at the capacity, presence or, respectively, type line are provided in the memory controller and are structured such that, dependent on adjacent voltage potential, a capacity, presence or, respectively, type information indicating the memory capacity, the presence or, respectively, the type of the inserted memory module is formed and stored memory-conforming for each mounting region, apparatus for communicating the control and address information to the mounting region being switched high-impedance.

17. The arrangement according to claim 16, wherein the capacity, presence or, respectively, type information are represented and stored by binary information.

18. An arrangement for determining a configuration of a memory that is formed by mounting regions accepting memory modules to which address lines proceeding from a memory controller are connected in parallel and having at least respectively one control line individually associated to mounting region from the memory controller to each mounting region comprising:, at least one of the address or control lines being defined as an information line for each mounting region;

coding device for forming and communicating configuration information individually associated to mounting region from the memory to the memory controller via the at least one information line;

evaluation device in the memory controller for evaluation and storing of configuration information communicated via the information line individually associated to mounting region;

a predetermined first resistor, connected to a predetermined first voltage potential, connected to each capacity, presence or, respectively, type line in the memory controller;

a second resistor, indicating the presence or, respectively, the memory capacity or, respectively, the type of memory module inserted in a mounting region, connected to the respective capacity or, respectively, presence or, respectively, type line and to a predetermined second voltage potential for each memory module inserted in a mounting region; and the first and second resistors provided in the memory controller and the mounting regions per capacity, presence or, respectively, type line are dimensioned such that voltage potentials formed by the memory controller for formation of control or, respectively, address information are connectable to the control lines or, respectively, address lines, the formation of control or, respectively, address information being deactivated during transmission of the configuration information.

19. The arrangement according to claim 18, wherein voltage evaluation devices for the evaluation of the voltage potentials adjacent at the capacity, presence or, respectively, type line are provided in the memory controller and are structured such that, dependent on adjacent voltage potential, a capacity, presence or, respectively, type information indicating the memory capacity, the presence or, respectively, the type of the inserted memory module is formed and stored memory-conforming for each mounting region, apparatus for communicating the control and address information to the mounting region being switched high-impedance.

20. The arrangement according to claim 19, wherein the capacity, presence or, respectively, type information are represented and stored by binary information.

* * * * *